April 19, 1966 R. E. ALLEN 3,247,473

COLD DIFFUSION BOND BETWEEN ACOUSTIC
DELAY LINE AND BACK ELECTRODE
OR ACOUSTIC ABSORBER
Original Filed Nov. 9, 1959

INVENTOR.
Richard E. Allen

BY Walter S. Zebrowski

ATTORNEY

United States Patent Office 3,247,473

Patented Apr. 19, 1966

3,247,473

COLD DIFFUSION BOND BETWEEN ACOUSTIC DELAY LINE AND BACK ELECTRODE OR ACOUSTIC ABSORBER

Richard E. Allen, Corning, N.Y., assignor to Corning Glass Works, Corning, N.Y., a corporation of New York

Original application Nov. 9, 1959, Ser. No. 851,724, now Patent No. 3,131,459, dated May 5, 1964. Divided and this application Sept. 19, 1963, Ser. No. 310,167

The portion of the term of the patent subsequent to May 5, 1981, has been disclaimed

2 Claims. (Cl. 333—30)

This application is a division of application Serial No. 851,724 filed November 9, 1959, now Patent No. 3,131,459.

This invention relates to the technique of bonding one body to another and more particularly to a cold diffusion method of bonding absorbing material to a solid ultrasonic delay line or to the transducer thereof.

In my Patent No. 3,131,460 entitled Method of Bonding a Crystal to a Delay Line, I have described a novel crystal-to-delay line bond and the process for making it. The subject application is directed to the transducer backing that has particular applicability to the transducer assembly of said co-pending application. Additionally, it will be obvious to those skilled in the art that the same techniques may be applied to bonding absorber material to the delay line body.

Examples of prior delay line absorber or baking material bonding methods involve either a hot solder method or an electroplating method. The hot solder method, exemplified by British Patent No. 800,519, and issued to the assignee of the subject application, deals with swabbing a hot, molten solder on the crystal to wet the surface and further teaches the application of the backing material to the wetted crystal surface.

The other method in the absorber of backing material bonding art is set forth in Patent No. 2,859,415, issued to M. D. Fagen on November 4, 1958. This patent teaches the application of absorbing material to delay lines using a fired silver paste as a base coat on the crystal and then electroplating the back electrode or absorbing material over the silver paste.

Both methods, while satisfactory for small production runs, suffer from the defect of exposing the delay lines and crystals to high thermal shock as well as to excessive handling. Both of these defects are serious since they tend to produce a high number of rejections and consequently increase the cost per unit item.

Additionally, and in both instances, there is a good possibility that the backing material will flow through cracks or holes in the crystal to short the crystal and thereby produce an inoperative delay line.

I have found that I am able to overcome the inherent disadvantages of the prior art systems of bonding back electrode or absorbing material to crystals and delay lines by utilizing a novel cold diffusion method of bonding. This cold diffusion method of bonding is considerably more desirable and is based on the greater affinity of gold-to-indium than indium-to-indium.

In accordance with the foregoing, it becomes an important object of the instant invention to provide a cold diffusion method of bonding backing or absorber material to crystals or delay lines.

One other important object of the instant invention is to provide a cold diffusion method of bonding backing or absorber material to crystals or delay lines that provides considerably less breakage from thermal shock during assembly.

Another important object of the instant invention is to provide a cold diffusion method of bonding backing or absorber material to crystals or delay lines that is noted by its greater ease of assembly.

Yet another important object of the instant invention is to provide a cold diffusion method of bonding backing or absorber material to crystals or delay lines that is noted by its lower assembly costs.

Still another important object of the instant invention is to provide a cold diffusion method of bonding backing or absorber material to crystals or delay lines that provides a complete bond.

A further important object of the instant invention is to provide a cold diffusion method of bonding backing or absorber material to crystals or delay lines that is reproducible from one delay line to another.

A still further important object of the instant invention is to provide a cold diffusion method of bonding backing or absorber material to crystals or delay lines that is relatively inexpensive and lends itself to a mass production type of assembly.

Another object of the instant invention is to provide a cold diffusion method of bonding backing or absorber material to crystals or delay lines that results in a considerable decrease in the number of transducer short circuits.

Other and more detailed objects of my invention, as well as further advantages thereof will become apparent to those skilled in the art from a consideration of the following specification and drawings in which.

In my co-pending application, I describe a method of successive crystal coatings wherein the outermost coating is a gold layer that has been rendered especially adherent by first depositing either successive layers of aluminum and nickel, or a single nickel-chromium layer on the crystal as an undercoat for the gold.

Figure 1:
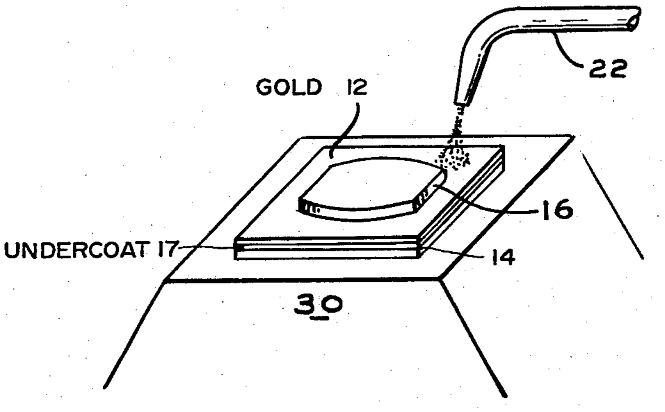
FIG. 1 is an oblique view of a delay line assembly illustrating removal of selected portions of metallic layers from a transducer surface.
Figure 2:
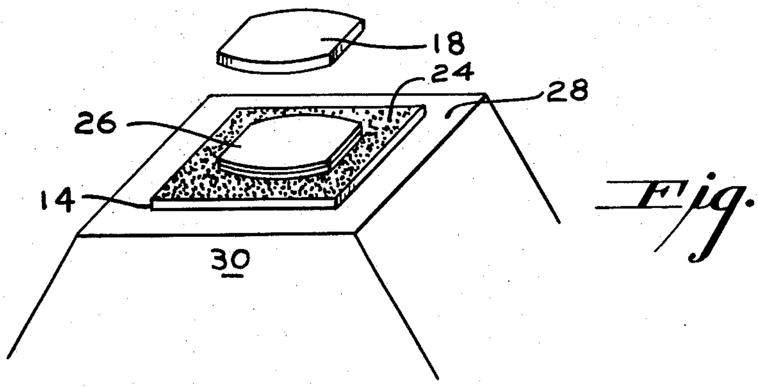
FIG. 2 is an oblique view of a delay line assembly illustrating the attachment of a back electrode to the transducer.

Referring now to FIGS. 1 and 2, there is shown a typical adherent, gold coating 12 on the surface of the bonded transducer 14 of delay line 30. I now locate a mask 16 having the same configuration as the desired indium back electrode 18, in the proper position, on the back of the bonded transducer 14. This mask may be held in place with rubber bands or any other suitable holding means, not shown. Gold coating 12 has an undercoat 17 on the back of the transducer 14, which undercoat preferably comprises successive layers of aluminum and nickel, however, may also comprise a single layer of nickel-chromium as hereinabove noted. Such gold coating and undercoat outside the boundaries of mask 16 are removed by gently sandblasting the surface as indicated by nozzle 22. With all coatings now removed, and having an exposed surface 24 (FIG. 2) on the transducer, I remove the residue of sand by gently blowing clean air thereover. The shield is then removed and the coated portion 26 of the transducer back as well as the exposed portion 28 of the delay line 30 is first brushed using a clean camels hair brush or other similar soft material and is then brushed with a solvent such as carbon tetrachloride.

It should be here noted that the mask 16 is shaped to conform to the desired configuration of the back electrode 18. This shape is determined by the desired acoustical properties and characteristics in accordance with principles well known to those skilled in the delay line art.

A piece of indium back electrode 18, no larger than the crystal but large enough to cover masked area 26, flat on both sides and having the desired thickness is cleaned in a cleaning solution which may consist of about ⅓ hydrofluoric acid, ⅓ nitric acid and about ⅓ water. The indium back electrode is then rinsed in running tap water, dried, and finally gently burnished, preferably with nylon parachute cloth wrapped around the finger. The burnished indium is then pressed onto the previously masked area 26 of the transducer 14 and maintained at a pressure of about 180 pounds per square inch and a temperature of about 150° C. A jig or vise is used to hold the backing material against the transducer. Once pressure is applied, it is preferably maintained in a vacuum of about 20 microns of mercury or less for approximately 16 hours. While maintaining the jig in a vacuum is preferable, I find that it is also possible to achieve good results if the bonding is done at atmospheric pressure in some inert atmosphere such as nitrogen or helium for example. The above bonding process produces a cold diffusion bond by diffusion of solid state indium into the gold layer on the crystal.

After the bonding is complete, the exact shape and position of the back electrode is now scribed on the exposed portion of the indium back electrode and the excess material is cut away with a sharp razor blade. This cutting operation is quite simple since the indium does not adhere to the sandblasted surface of the crystal.

The above-described process is admirably adapted to very thin crystals which may range in thickness from .008–.002 inch. However, another embodiment, which finds particular applicability to thicker, low frequency crystals is as follows:

Instead of initially masking and sandblasting, it is possible to achieve the same end result by applying the indium strip directly to the gold layer on the transducer surface and heating and applying pressure as previously described. Thereafter, an outline of the desired configuration of back electrode is scribed on the strip and the excess indium, which would fall outside of the desired shape of the back electrode, is carefully scraped away until the gold surface is reached. At this point, the gold surface of the transducer as well as the exposed delay line facet surface is cleaned by sandblasting, as before, thereby producing the desired, shaped back electrode.

While I have described my process in terms of applying a back electrode to a delay line transducer it will be obvious to those skilled in the art that the same technique may be utilized to apply a series of acoustic absorbers or "stops" at strategic corners of a multi-facet delay line to absorb signals that diverge unduly from the prescribed path.

While I have described what are presently considered the preferred embodiments of my invention, it will be obvious to those skilled in the art that various other changes and modifications may be made therein without departing from the inventive concept contained herein, and it is therefore, aimed in the appended claims, to cover all such changes and modifications that fall within the true spirit and scope of my invention.

I claim:

1. A delay line assembly comprising a delay medium, a crystal transducer bonded to said delay medium, said transducer having a plurality of metallic layers selected from the group consisting of: (1) aluminum, nickel, and gold, (2) nickel-chromium and gold, and (3) gold applied to the outer surface thereof, a back electrode consisting essentially of indium, and a cold diffusion bond between said back electrode and said transducer formed at a temperature of about 150° C. and under a pressure of approximately 180 pounds per square inch, the metallic layer adjacent said back electrode being gold.

2. A delay line assembly comprising a delay medium having a facet with a plurality of metallic layers applied thereto, said layers selected from the group consisting of: (1) aluminum, nickel, and gold, (2) nickel-chromium and gold, and (3) gold, acoustic absorber material consisting of indium, and a cold diffusion bond between said acoustic absorber material and said facet formed at a temperature of about 150° C. and under a pressure of approximately 180 pounds per square inch, the metallic layer adjacent said absorber material being gold.

References Cited by the Examiner

UNITED STATES PATENTS

| | | | |
|---|---|---|---|
| 2,672,590 | 3/1954 | McSkimin | 333—30 |
| 2,709,147 | 5/1955 | Ziegler | 154—128 |
| 2,859,415 | 11/1958 | Fagen | 333—30 |
| 2,964,839 | 12/1960 | Marafioti | 29—195 |
| 3,042,550 | 7/1962 | Allen et al. | 117—217 |

HERMAN KARL SAALBACH, *Primary Examiner.*